US007002147B1

(12) United States Patent
Hansknecht

(10) Patent No.: US 7,002,147 B1
(45) Date of Patent: Feb. 21, 2006

(54) HIGHLY SENSITIVE VACUUM ION PUMP CURRENT MEASUREMENT SYSTEM

(75) Inventor: John Christopher Hansknecht, Williamsburg, VA (US)

(73) Assignee: Southeastern Univ. Research Assn., Newport News, VA (US)

( * ) Notice: Subject to any disclaimer, the term of this patent is extended or adjusted under 35 U.S.C. 154(b) by 0 days.

(21) Appl. No.: 10/959,463

(22) Filed: Oct. 6, 2004

(51) Int. Cl.
*H01J 37/244* (2006.01)

(52) U.S. Cl. .......................... 250/289; 73/471; 73/735

(58) Field of Classification Search ................ 250/289
See application file for complete search history.

(56) References Cited

U.S. PATENT DOCUMENTS 4,835,479 A * 5/1989 Haines ...................... 324/540

* cited by examiner

*Primary Examiner*—Nikita Wells
*Assistant Examiner*—James J. Leyvourne

(57) ABSTRACT

A vacuum system comprising: 1) an ion pump; 2) power supply; 3) a high voltage DC—DC converter drawing power from the power supply and powering the vacuum pump; 4) a feedback network comprising an ammeter circuit including an operational amplifier and a series of relay controlled scaling resistors of different resistance for detecting circuit feedback; 5) an optional power block section intermediate the power supply and the high voltage DC—DC converter; and 6) a microprocessor receiving feedback information from the feedback network, controlling which of the scaling resistors should be in the circuit and manipulating data from the feedback network to provide accurate vacuum measurement to an operator.

4 Claims, 1 Drawing Sheet

HIGHLY SENSITIVE VACUUM ION PUMP CURRENT MEASUREMENT SYSTEM

The United States of America may have certain rights to this invention under Management and Operating Contract No. DE-AC05-84ER 40150 from the Department of Energy.

FIELD OF THE INVENTION

The present invention relates to improvements in the monitoring of vacuum levels and more particularly to the monitoring of ultra-high vacuum levels on the order of below about $1 \times 10^{-9}$ Torr produced using ion pumps.

BACKGROUND OF THE INVENTION

It can be very difficult and expensive to monitor vacuum below $1 \times 10^{-9}$ Torr (i.e. the pressure regimen in photoinjector and other high vacuum systems used throughout the world). Vacuum gauges designed to operate at this pressure range, such as extractor gauges and residual gas analyzers, cost thousands of dollars. At the Jefferson National Laboratories, for example, where vacuum systems can be very large (i.e. the entire length of a 10 meter photoinjector accelerator beam line), it is cost prohibitive to install enough gauges to accurately monitor the vacuum quality throughout the entire system.

Besides the expensive involved in such installations, these types of vacuum gauges suffer other shortcomings. The gauges contain hot filaments that produce gas within the vacuum system. It is counterproductive to use a vacuum gauge that inherently degrades vacuum while in use. The gauges also produce light, that can generate unwanted photoemission from photocathodes within the polarized electron sources used in such installations.

Ion pumps are commonly and extensively used throughout the accelerator facilities of the Jefferson National Laboratory and at other government and commercial institutions to generate ultra high vacuums. Ion pumps contain metal plates that are biased at high voltage. Gas within the vacuum chamber is ionized as it passes between the ion pump plates (i.e. electrons are stripped from the gas atoms and molecules). Once ionized, the gas atoms and molecules embed themselves within the metal plates of the ion pump. In this manner, the gas within the vacuum chamber is "pumped" away, i.e. removed from the vacuum chamber.

The ionized gas that becomes embedded within the plates of the ion pump constitutes an electrical current. This electrical current provides a measure of the vacuum quality within the vacuum chamber. At high pressure, ion pumps produce relatively large electrical current (milliamperes) that is easily measured. At lower pressures, ion pumps produce less current. At extremely low pressure, commonly referred to as "ultra high vacuum", it can be difficult to measure the small electrical current that is produced by an ion pump.

The manufacturers of ion pumps provide a measurement of the electrical current produced by an ion pump. Unfortunately, this value is limited to $\sim 1 \times 10^{-6}$ amperes, which corresponds to $1 \times 10^{-9}$ Torr vacuum pressure. Many ultra high vacuum systems operate below this value.

Thus, there exists a need for a coat effective system and method for monitoring ultra high vacuum environments such as those found in many institutional government and industrial installations.

OBJECT OF THE INVENTION

It is therefore an object of the present invention to provide a cost effective means for accurately measuring ultra-high vacuum levels on the order of below about $1 \times 10^{-9}$ Torr, especially those produced using ion pumps.

SUMMARY OF THE INVENTION

The vacuum system of the present invention comprises: 1) an ion pump; 2) power supply; 3) a high voltage DC—DC converter having drawing power from the power supply and powering the vacuum pump; 4) a feedback network comprising an ammeter circuit including an operational amplifier and a series of relay controlled scaling resistors of different resistance for detecting circuit feedback; 5) an optional power block section intermediate the power supply and the high voltage DC—DC converter; and 6) a microprocessor receiving feedback information from the feedback network, controlling which of the scaling resistors should be in the circuit and manipulating data from the feedback network to provide accurate vacuum measurement to an operator. The high voltage DC—DC converter feeds power to the ion pump and the current drawn by the high voltage DC—DC converter high voltage section is balanced by the current through feedback from the ammeter circuit operational amplifier. The microprocessor samples the voltage appearing across the feedback network and determines whether the feedback resistance should be changed to a higher or lower scale value. According to a preferred embodiment, the high voltage DC—DC converter is fully isolated to avoid current leakage that might affect the current measurement.

DETAILED DESCRIPTION

Figure 1:
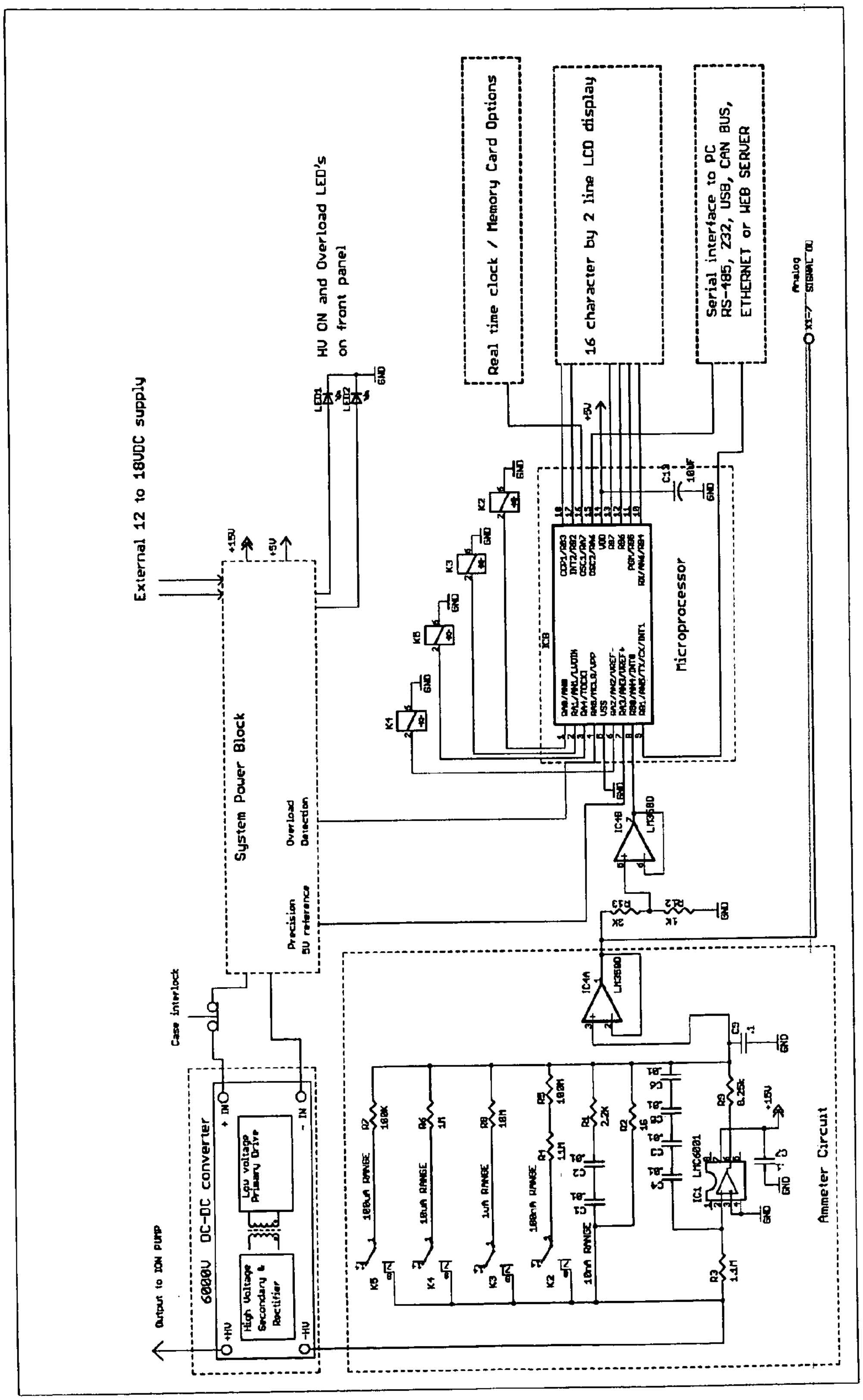
FIG. 1 is a schematic diagram of a preferred embodiment of the vacuum system of the present invention.

The UHV monitoring system of the present invention is a collection of several key components that combine to form a system with several unique capabilities not currently available in commercially marketed ion pump controllers.

An ion pump is normally supplied with approximately 6000 VDC. If a "bad" vacuum exists (higher pressure), the electron current supplied from the power supply to the pump will be higher. If a good vacuum exists (lower pressure) the electron current will be lower. Extremely good vacuum is referred to as UHV or Ultra-High Vacuum and will result in a very small current draw from the power supply. The circuitry of the system of the present invention allows one to measure currents a factor of 1000 lower than present commercially available systems.

Referring now to FIG. 1 that depicts a schematic view of the vacuum monitoring system of the present invention, the ammeter circuit comprises as its heart an operational amplifier designated IC1. A suitable such operational amplifier is marketed by National Semiconductor Corporation, 2900 Semiconductor Drive, Santa Clara, Calif. 95052 as an "Ultra-Low Input Current Amplifier" although other similar devices would be equally useful. The key requirement for building a precision ammeter circuit for measuring very low currents is finding an Op-Amp that only requires femto-Amps (fA) of input bias current to operate.

The operation of the ammeter section is straight forward to anyone skilled in the art of electronics. IC1 will work to maintain a virtual ground at pin 2 of IC1 by applying the output voltage necessary on pin 6 of IC1 through the feedback resistor selected (R2, R5, R6, R7, or R8). During operation, the current drawn by the high voltage DC—DC converter high voltage section will be balanced by the current through the feedback network of IC1. The microprocessor section (described in greater detail below) samples the voltage appearing across the feedback network and makes a determination of whether or not the feedback resistance should be changed to a higher or lower scale value through the opening or closing of relays K2–K5. All other capacitors and resistors in the ammeter circuit serve to match the impedance of the circuit to the load and prevent oscillations of IC1. When dealing with circuits that are intended to measure into the pico-Amp regime, great care must be exercised in the board layout with regard to component placement and possible current leakage paths. Additionally when dealing with high ohmic value feedback resistors, parallel resistance paths must be eliminated. In this circuit, the parallel resistance paths are completely removed from the circuit by operation of relays K2, K3, K4, and K5. The resistors are only brought into the circuit when the microprocessor calls for a specific current scale. When all relays are open, the circuit feedback path consists of a 1 GigOhm (1000 MegOhm) resistor. This is the most sensitive measurement scale and is capable of measuring 0–10 nanoamps with pico amp resolution. The circuit can display current from 10 pico-amps ($0.01e^{-9}$ amps) through 100 micro-amps ($1.00e^{-5}$ amps) in its current configuration. The values of the feedback resistors can be modified if needed to measure higher currents, but the highest sensitivity range is already optimized at the resistor values shown for this circuit.

Referring again to the high voltage DC—DC converter section shown in FIG. 1, in order to accurately measure the total current supplied to the ion pump needs to pass through the ammeter circuit. If any current leakage were to occur from the low voltage side of the DC—DC converter to the high voltage side, a significant error would be introduced in the current measurement. The Model F60 (compact, 10 Watt, High Voltage Module) from EMCO High Voltage Corporation, 70 Forest Products Road, Sutter Creek, Calif. 95685 is ideal for this application. With the inherent ability to isolate 9,500 V from the input side to the pseudo-grounded output, it has no measurable leakage in this application. (There is, of course, the option of measuring the current in a floating manner on the positive lead of a conventional power supply, but this option is overly complicated in that it requires the design of a floating power supply block and provide galvanically isolated communication to the microprocessor.)

It should also be noted that the present design is configured to drive ion pumps that require a positive 6000 Vdc. The circuitry can be easily modified to drive an ion pump requiring negative 6000 VDC. The DC—DC converter can also be changed to provide a lower or higher operating voltage and current. If a particular application requires current sourcing above 100 uA, one could quite easily change the values of the scaling resistors and provide a heavier duty DC—DC converter to allow higher currents.

Referring now to the system power blocking section shown in FIG. 1, the power block section nominally accepts 18 VDC from an external power supply (Wall Wart or User supplied power). It then generates appropriate voltages to drive the surrounding electronics. It also includes a simple ammeter section that monitors the primary drive current supplied to the 6000V DC—DC converter. By monitoring the current supplied, the circuit can provide simple go-no go information concerning the current draw of the converter. A nominal current draw of approximately 200 mA indicates that the converter is functioning properly and is producing high voltage. If the current draw exceeds 400 mA then a flag is sent to the microprocessor and an alarm, for example a high brightness over-current LED is lit, to indicate an excessive current draw from the unit. This output serves as a backup alert to system operators that a severe vacuum problem exists in what should otherwise be an ultra high vacuum environment. This alarm can easily be made audible. If desired, the system can also be run from 12 VDC. The present design will function at this lower voltage with a slight deterioration of readout accuracy. The reason 12V is mentioned is due to the fact that the whole assembly could be powered up from a standard 12 volt car battery for many weeks if the ion pump is connected to an ultra-high vacuum system. This is convenient in the event of a long term power failure. Keeping an ion pump "alive" in a vacuum system will cause it to continue to pump away residual gasses and maintain the ultra-high vacuum condition. Another benefit of the system of the present invention over existing ion pump system is the fact that this entire assembly is powered with a low voltage DC source. Many users of ion pumps prefer to place the pump supply in close proximity to the pump. Some supplies are even mounted to the pump itself (which is an option for this design with a simple packaging change). The inventor is not aware of any commercial ion pump supplies that are DC powered. It is often quite advantageous to keep alternating current fields as far from an experiment as possible. This design can solve this problem.

Referring now to the microprocessor section of the monitoring system of the present invention depicted in FIG. 1, the microprocessor is the "brain" that ties all the components together. The microprocessor code performs the following functions:

a. reads the voltage appearing at the output of the ammeter using an internal ADC. The 10 bit ADC of the chosen microprocessor allows 1024 data points per decade over 6 decades of measurement which provides resolution to two decimal places on the chosen scale (i.e. 9.99e–9 Amps);
b. makes a determination of whether or not the correct scaling resistor is selected and changes the scale when the calculated current is too high or too low for the present scaling resistor;
c. performs digital filtering of the data reported to create "bump-less" scale changes;
d. calculates actual current based on the ADC reading and scale it has selected;
e. reports the current to the LCD display in formatted scientific notation along with the display of the module address assigned;
f. handles networking protocols to report the current to an external computer; and
g. is capable of handling additional functions such as time stamping and data-logging, if desired.

While a particular microprocessor configuration is depicted in FIG. 1, it will be readily apparent to the skilled artisan that other similar configurations are equally useful.

Other optional features of the system of the present invention shown in FIG. 1 include an LCD display such as the 16 character by 2 line backlit display indicated. The communication interface can be selectable between RS-232 and RS-485 interfaces. The system could also include a graphics LCD display that is capable of displaying a strip chart type view of the vacuum trend. The communication interface could also be modified to allow other standard communication interfaces such as USB, CAN bus, Ethernet, or on-board Web server. A self-diagnostic function in which the microprocessor inserts a known load into the high voltage output and checks for the appropriate circuit response could also be included.

There has thus been described a vacuum system utilizing an unmodified ion vacuum pump capable of monitoring ultra high vacuum pressures below about $1\times10^{-9}$ Torr. More specifically, there has been described an electrical circuit that enhances the ability to monitor the electrical current produced by an ion pump from the currently commercial limit of $1\times10^{4}$ amperes to ~$0.001\times10^{-6}$ amperes, a factor of 1000 improvement over prior art devices. With the device of the present invention, it is possible to extensively and inexpensively monitor the vacuum pressure at many locations throughout a very long photoinjector system without introducing additional vacuum components and gauges, some of which may effect vacuum degradation in their operation.

As the invention has been described, it will be apparent to those skilled in the art that the same may be varied in many ways without departing from the spirit and scope of the invention. Any and all such modifications are intended to be included within the scope of the appended claims.

What is claimed is:

1. A vacuum system capable of providing a monitored ultra high vacuum on the order of below about $1\times10^{-9}$ Torr comprising:

a) an ion pump;

b) a power supply;

c) a high voltage DC—DC converter drawing power from the power supply and powering the ion pump;

d) a feedback network receiving input from the high voltage DC—DC converter and comprising an ammeter circuit including an operational amplifier and a series of relay controlled scaling resistors of different resistances for detecting circuit feedback from the high voltage DC—DC converter; and e) a microprocessor receiving feedback information from the feedback network, controlling which of the scaling resistors are in the circuit and manipulating data from the feedback network to provide accurate vacuum measurement to an operator.

2. The vacuum system of claim 1 wherein the high voltage DC—DC converter has a low voltage side and further including a power block section electrically connected intermediate the power supply and the high voltage DC—DC converter low voltage side that monitors power supplied by the high voltage DC—DC converter and provides information as to the current drawn by the high voltage DC—DC converter to an operator.

3. A vacuum monitoring system capable of monitoring an ion pump vacuum system including an ion pump powered by a power supply at ultra high vacuums on the order of below about $1\times10^{-9}$ Torr comprising:

a) a high voltage DC—DC converter drawing power from the power supply and powering the ion pump;

b) a feedback network receiving input from the high voltage DC—DC converter and comprising an ammeter circuit including an operational amplifier and a series of relay controlled scaling resistors of different resistances for detecting circuit feedback from the high voltage DC—DC converter; and c) a microprocessor receiving feedback information from the feedback network, controlling which of the scaling resistors are in the circuit based on level of voltage feedback received from the feedback network and manipulating data from the feedback network to provide accurate vacuum measurement to an operator.

4. The vacuum monitoring system of claim 3 wherein the high voltage DC—DC converter has a low voltage side and further including a power block section electrically connected intermediate the power supply and the high voltage DC—DC converter low voltage side that monitors power supplied by the high voltage DC—DC converter and provides information as to the current drawn by the high voltage DC—DC converter to an operator.

* * * * *